United States Patent [19]

Sakato

[11] Patent Number: 4,512,657

[45] Date of Patent: Apr. 23, 1985

[54] EXPOSURE CONTROL SYSTEM

[75] Inventor: Keiichiro Sakato, Kawasaki, Japan

[73] Assignee: Nippon Kogaku K.K., Tokyo, Japan

[21] Appl. No.: 533,598

[22] Filed: Sep. 19, 1983

[30] Foreign Application Priority Data

Sep. 20, 1982 [JP] Japan .................... 57-162162

[51] Int. Cl.³ .......................... G03B 27/74
[52] U.S. Cl. ........................ 355/68; 355/69; 355/71
[58] Field of Search ................ 355/67–69, 355/71; 354/458, 459, 460; 356/224–226; 250/232, 233

[56] References Cited

U.S. PATENT DOCUMENTS 4,034,383  7/1977  Mashimo et al. .................. 354/458

FOREIGN PATENT DOCUMENTS 57-71132  5/1982  Japan .

Primary Examiner—L. T. Hix
Assistant Examiner—Della J. Rutledge
Attorney, Agent, or Firm—Fleit, Jacobson, Cohn & Price

[57] ABSTRACT

In the printing of an IC circuit pattern on a wafer or photo mask, a system performs an exposure control by measuring the amount of light passed through a shutter and controlling the opening and closing operations of the shutter. The system includes means whereby a superposed measurement of an exposure light quantity during the opening operation of the shutter or the time interval between the time that the opening is started and the time that the opening is completed is effected by preliminarily raising the quantity by an amount corresponding to an excessive exposure light quantity during the shutting operation of the shutter or the time interval between the time that the shutting is started and the time that the shutting is completed, thereby controlling the shutter up to the maximum speed determined by the characteristics of a mechanism itself including the driving system of the shutter.

3 Claims, 10 Drawing Figures

EXPOSURE CONTROL SYSTEM

BACKGROUND OF THE INVENTION

Field of the Invention

This invention relates to apparatus for exposing or imaging an IC (integrated circuit) circuit pattern on a wafer or photo mask coated with a photosensitive material and more particularly to a system for controlling the exposure value in the apparatus.

In recent years, there has been a demand for ever increasing fineness of circuit patterns in the manufacture of semiconductor devices, particularly ICs and also a high degree of exposure control has been required for apparatus designed to print or place a pattern having a line-width of 1 μm or less on a wafer or so-called exposure apparatus.

Generally, the exposure apparatus for exposing an image of a circuit pattern on a wafer or photo mask should preferably always apply a constant exposure value to the photosensitive material (photo-resist) applied onto a wafer.

The exposure apparatus projects an image of a reticle or photo mask having an IC circuit pattern formed thereon onto a photosensitive material through an optical system including an exposure radiation source, e.g., a light source, lenses, etc. Where the exposure light source is always turned on, the exposure apparatus must include a shutter for controlling the exposure time of the photosensitive material. Moreover, where the light intensity of the exposure light source is subject to variation due to deterioration of the exposure light source, the exposure apparatus must include means for measuring the exposure value applied to the photosensitive material by the light from the exposure light source through the shutter and means for controlling the shutter in accordance with the measured exposure value for the purpose of maintaining the exposure value of the photo-sensitive material constant. The light measuring means and the shutter control means may be conceived to operate as follows. The control means changes the shutter from the shut position (closed position) to the wide open position and the light measuring means measures the amount of the exposure light in response to the change. When the exposure value reaches a proper exposure value, the shutter is changed again from the wide open position to the shut position.

However, there is a disadvantage that the photosensitive material is still exposed even during the transition of the shutter from the wide open position to the shut position in response to the attainment of the proper exposure value by the exposure value of the photosensitive material.

While the excessive exposure value to the photosensitive material can be estimated to determine the total exposure value if the light intensity of the light source is always constant, in fact, however, the brightness of the light source varies considerably due to the deterioration of the lamp. This variation ($E_o - E_o'$) of the excessive exposure value can be ignored if the light intensity of the light source is low and the exposure time is sufficiently long. However, if the light intensity of the light source increases thus increasing the ratio of the exposure value during the shutting operation of the shutter to the total exposure value, the variation of the total exposure value due to the variation of the excessive exposure value presents a serious problem. While it is generally considered that the variation of the total exposure value must be less than several percent in the exposure value control, in the above-mentioned case the conventional apparatus gives no consideration to the excessive exposure value with the resulting disadvantage that it is impossible to obtain a stable exposure value over a long period of time.

SUMMARY OF THE INVENTION

It is therefore the primary object of the invention to provide an exposure apparatus for effecting an exposure control so as to always maintain constant the total exposure value irrespective of the light intensity of a light source.

More specifically, in order to accomplish the above and another equally important objects, an exposure control system according to the invention comprises a shutter which is opened and shut to allow and prevent the passage of the light from a light source to an object to be exposed, a photoelectric detector for detecting the intensity of the light passed through the shutter, a photoelectric detector for detecting an intensity of the light passed through the shutter a light measuring circuit for measuring the exposure value falling on the object from the opening operation starting time of the shutter in accordance with the output signal from the photoelectric detector, drive means for initiating the shutting operation of the shutter when the measured exposure value reaches a predetermined value, and control means for controlling the light measuring sensitivity of the light measuring circuit during the time interval between the opening operation starting time of the shutter and the completion of the opening such that the exposure value measured by the light measuring circuit during the time interval between the opening operation starting time of the shutter and the completion of the opening corresponds to a value of the measured quantity having superposed thereon an excessive exposure value during the time interval between the shutting operation starting time of the shutter and the completion of the shutting, whereby the exposure value is measured in the form of a quantity having preliminarily superposed thereon an estimated excessive exposure value during the time interval between the time that the shutter starts its shutting operation and the time that the shutting is completed thus making it possible to accomplish an accurate exposure control and control the shutter up to its maximum speed.

In accordance with one form, the light measuring circuit includes an amplifier circuit for amplifying the output signal of the photoelectric detector, whereby the amplification factor of the amplifier circuit is varied by the control means during the time interval between the time that the opening operation of the shutter is started and the time that the opening is completed.

In accordance with another form, the light measuring circuit includes an amplifier circuit for amplifying the output signal from the photoelectric detector and an integrator circuit for integrating the signal amplified by the amplifier circuit to measure the amount of exposure light, whereby the time constant of the integrator circuit is varied by the control means during the time that the opening operation of the shutter is started and the time that the opening is completed.

DESCRIPTION OF THE PREFERRED EMBODIMENTS

Figure 1:
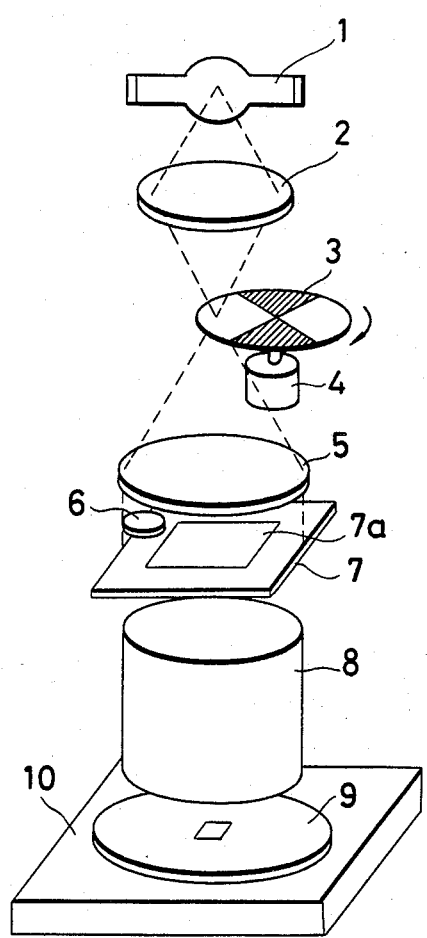
FIG. 1 is a perspective view showing schematically the construction of an exposure apparatus according to the invention.
Figure 2:
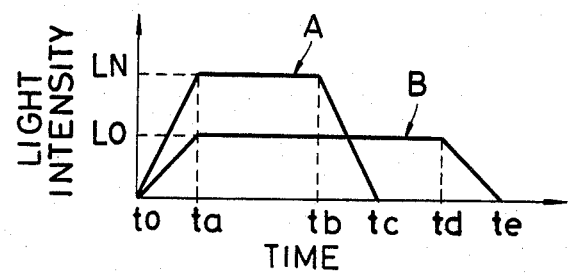
FIG. 2 is a graph showing an exposure light intensity characteristic of a light source.

An exposure apparatus according to the invention shown schematically in FIG. 1 is a projection-type exposure apparatus in which the light from an exposure light source such as a mercury lamp 1 is concentrated by a condenser lens 2 and then projected through a rotary disk 3 forming a shutter and through a condenser lens 5 and a projection lens 8 onto a wafer 9 (or a photo mask) placed on a stage 10 adapted for two-dimensional movement. The rotary disk 3 is divided into four parts to provide intercepting portions (the hatched portions in the Figure) alternate with transmitting portions. Also, the rotary disk 3 is rotated in one direction (in a clockwise direction in the Figure) by a pulse motor 4 so as to serve as a rotary shutter. A glass substrate 7 (a reticle or photo mask) having a desired IC circuit pattern is placed between the condenser lens 5 and the projection lens 8 so that an area 7a formed with the circuit pattern on the glass substrate 7 is projected onto the wafer 9 and the wafer 9 is exposed. On the other hand, a photoelectric detector 6 comprises a photoelectric conversion element of the type adapted to detect the light intensity of the light source and the detector 6 is positioned above the glass substrate 7 so as not to intercept the light to the area 7a but to measure the light passed through the shutter. The output of the photoelectric detector 6 is used for exposure control purposes. With this apparatus, structurally the opening and shutting operation periods of the shutter are long ranging from several m sec to several tens m sec. FIG. 2 shows the variation of the light intensity due to the exposing operation (the values detected by the detector 6 or the values measured on the wafer 9). In the Figure, the abscissa represents the exposure time of the wafer 9 and the ordinate represents the light intensity. Two trapezoidal broken lines A and B show different forms due to the deterioration of the light source lamp. When the lamp is new and the light intensity is high, the resulting characteristic becomes as shown by the broken line A. When the lamp deteriorates so that the light intensity decreases, the resulting characteristic becomes as shown by the broken line B. Note that $L_N$ and $L_O$ respectively represent the light intensities of the broken lines A and B at the upper bottom portions or when the shutter is fully opened. Such trapezoidal light intensity characteristic results from the opening and shutting operation periods of the shutter. In other words, such characteristic results from the time required for the rotary disk 3 of the type shown in FIG. 1 to turn ¼ of a revolution. In FIG. 2, the interval $(t_a-t_o)$ indicates the time required for the rotary disk 3 blocking the light by its intercepting portion to rotate ¼ of a revolution and thereby allow complete passage of the light (hereinafter referred to as an opening operation period). Note that $t_o$ represents the time at which the rotary disk 3 starts rotating. Then, after the lapse of the interval $(t_a-t_o)$, the rotary disk 3 completely transmits the light (hereinafter referred to as a wide open shutter) and the exposure light stabilizes with the light intensity $L_N$ or $L_O$. After the lapse of a desired exposure time, namely, at a time $t_b$ in the case of the broken line A or at a time $t_d$ in the case of the broken line B, the rotary disk 3 further rotates ¼ of a revolution and the light is blocked by the intercepting portion. The time required for the light to be blocked completely (hereinafter referred to as a shutting operation period) is an interval $(t_c-t_b)$ in the case of the broken line A and an interval $(t_e-t_d)$ in the case of the broken line B. In this case, in view of the construction of the shutter, the opening operation period and the shutting operation period are substantially equal to each other so that the interval $(t_c-t_b)$ and the interval $(t_e-t_d)$ are equal to each other and they are also practically equal to the interval $(t_a-t_o)$.

Figure 3:
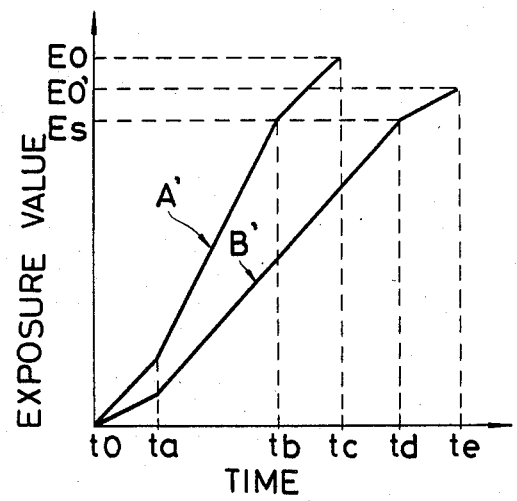
FIG. 3 is a graph showing a conventional exposure control characteristic.

In the graph of FIG. 3 broken lines A' and B' show the exposure values corresponding to the broken lines A and B. FIG. 3 shows the relationship between the exposure value of the wafer 9 and the time when the shutter is changed from the wide open condition to the fully shut condition after the proper exposure of the wafer 9. In the graph of FIG. 3, the abscissa represents the same time axis as FIG. 2 and the ordinate represents the exposure value. As in the case of FIG. 2, the time interval from the exposure starting time $t_o$ to the time $t_a$ is the opening operation period of the shutter and the exposure value increases gradually. The wide open period is from the time $t_a$ to the time $t_b$ in the case of the broken line A' and from the time $t_a$ to the time $t_d$ in the case of the broken line B'. As shown by the broken lines A' and B', respectively, the shutting operation of the shutter is started when the exposure value reaches a desired value $E_S$.

However, the exposure is still made during the interval $(t_c-t_b)$ or $(t_e-t_d)$ required for the shutter to shut completely. As a result, the total exposure value becomes $E_O$ or $E_O'$ and this is in excess of the predetermined desired value $E_S$ by $(E_O-E_S)$ or $(E_O'-E_S)$.

While the total exposure value can be determined by estimating the excessive exposure value to the photosensitive material if the light intensity of the light source is always constant, in fact the brightness of the light source varies considerably due to deterioration of the lamp. Thus, as shown in FIG. 3, the excessive quantity varies even the interval $(t_c-t_b)$ is equal to the interval $(t_e-t_d)$.

Figure 4:
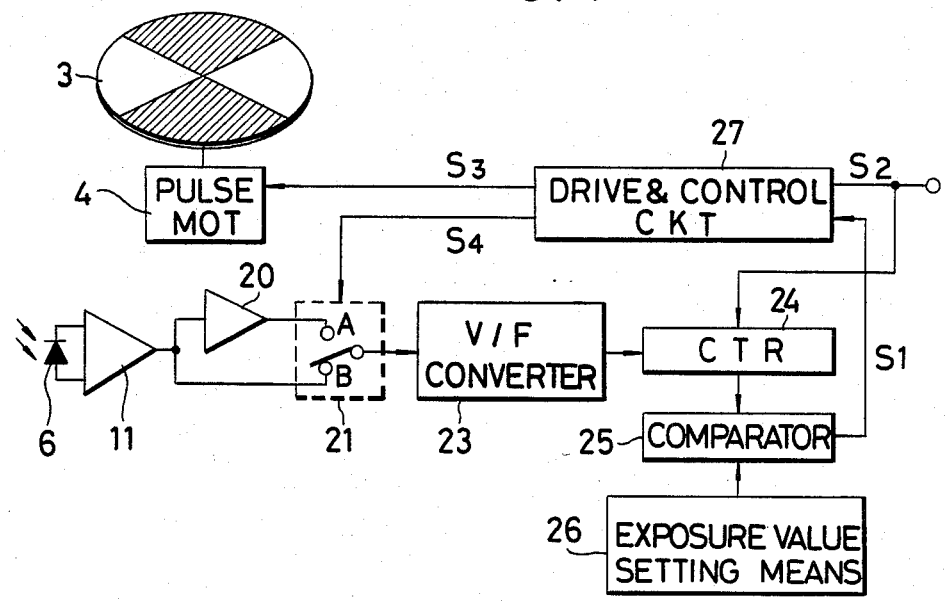
FIG. 4 is a block diagram showing the circuit construction of an exposure control system according to the invention.

FIG. 4 shows an embodiment of the present invention. In the Figure, the same reference numerals as used in FIG. 1 indicate component parts of the same functions and a compensating amplifier 20 is connected in series with an amplifier 11 for amplifying the light intensity signal from the photoelectric detector 6. The outputs from the amplifiers 11 and 20 are selectively selected and applied by a switch 21 comprising for example a semiconductor analog switch to a voltage/frequency converter 23. The converter 23 generates a number of output pulses indicative of the exposure value. A counter 24 counts the number of output pulses from the converter 23. A comparator 25 compares a value corresponding to the proper exposure value preset by exposure value setting means 26 and the count result of the counter 24 and the comparator 25 generates a shutter closing signal $S_1$ when there is an equality between the two.

The shutter closing signal $S_1$ and a shutter opening signal $S_2$ from operating means (not shown) are applied to a shutter ON/OFF drive and control circuit 27. When one or the other of the signals $S_1$ and $S_2$ is applied, the drive and control circuit 27 applies a driving signal $S_3$ consisting of a given number of pulses to the pulse motor 4 and thus the pulse motor 4 rotates the shutter 3 $\frac{1}{4}$ of a revolution. When at least the shutter opening signal $S_2$ is applied, the control circuit 27 generates a switching signal $S_4$ for switching the switch 21 to a contact A during the time interval between the time that the signal $S_2$ is applied or the shutter opening operation starting time and the time of completing the opening which is predetermined in accordance with the shutter construction. In other words, for the light measuring circuit including the amplifiers 11 and 20 and the converter 23, the drive and control circuit 27 forms, along with the counter 24 and the comparator 25, driving means for starting the shutting operation of the shutter 3 when the measured exposure value becomes equal to the present value and the drive and control circuit 27 also forms, along with the switch 21, control means for controlling the light measuring sensitivity of the light measuring circuit during the time interval between the shutter opening operation starting time and the completion of the opening such that the exposure value measured by the light measuring circuit during the time interval between the shutter opening operation starting time and the completion of the opening corresponds to a value of the measured quantity having superposed thereon an excessive exposure light quantity for the interval between the time that the shutting operation of the shutter is started and the time that the shutting is completed. In accordance with the present embodiment, this control of the light measuring sensitivity is accomplished by increasing the overall amplification factor of the light measuring circuit during the time that the switch 21 is switched to the contact A. The counter 24 reset by the shutter opening signal $S_2$ to start the counting.

Figure 5:
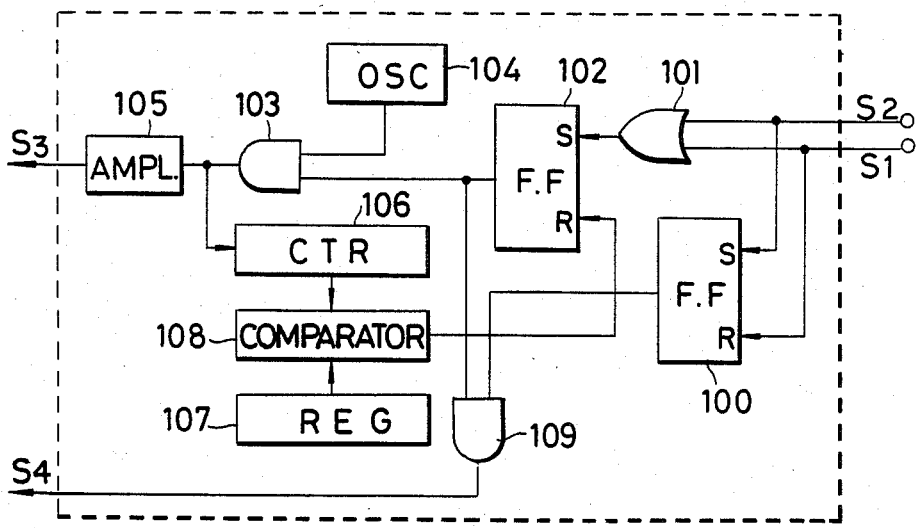
FIG. 5 is a block diagram showing an exemplary circuit construction of the drive and control circuit shown in FIG. 4.

The drive and control circuit 27 has a circuit construction such as is shown in FIG. 5. In the Figure, the shutter closing signal $S_1$ and the shutter opening signal $S_2$ are applied to a flip-flop 100 and they are also applied to an OR gate 101. Note that a logic level "H" is considered as a positive logic for each of the signals $S_1$ and $S_2$ in the following description. The shutter closing signal $S_1$ is applied to the reset input terminal of the flip-flop 100 and the shutter opening signal $S_2$ is applied to the set input terminal of the flip-flop 100. The output terminal of the OR gate 101 is connected to the set input terminal of another flip-flop 102. The output terminal of the flip-flop 102 is connected to an AND gate 103 for gating the output pulses from an oscillator 104 and an output signal from the AND gate 103 is passed through a buffer amplifier 105 and used as a driving signal $S_3$ for the pulse motor 4. The output signal pulses from the AND gate 103 are counted by a counter 106. A comparator 108 compares a digital value equal to the number of pulses required for rotating the shutter 3 a quarter of a revolution and a predetermined output of a register 107. In other words, when the count value of the counter 106 becomes equal to the predetermined digital value of the register 107, the comprator 108 generates an equality pulse to change the output state of the flip-flop 102. The outputs of the flip-flops 100 and 102 are applied to an AND gate 109 and the AND gate 109 causes the switching signal $S_4$ to go to "H" only when both of the applied inputs are at "H". Also, the switch 21 is switched to the contact A when the switching signal $S_4$ goes to "H" and the switch 21 is switched to the contact B when the switching signal $S_4$ goes to "L".

The operation of the embodiment shown in FIGS. 4 and 5 will now be described. Assuming now that the shutter 3 is closed and that the outputs of the flip-flops 100 and 102 are both at "L" and also the count values of the counters 24 and 106 are both zero. In this condition, when the shutter opening signal $S_2$ goes to "H", the outputs of the flip-flops 100 and 102 go to "H". As a result, the output of the AND gate 109 or the switching signal $S_4$ simultaneously goes to "H" so that the switch 21 is switched to the contact A and the amplifiers 11 and 20 are inserted in series thus enhancing the light measuring sensitivity.

As regards the gain of the amplifier 20, if the characteristic of the shutter 3 is such that the opening operation period $(t_a-t_o)$ and the shutting operation periods $(t_c-t_b)$ and $(t_e-t_d)$ are substantially the same and also the slope of the rise of the shutter opening and the slope of the fall of the shutter closing are the same as shown in FIG. 3, the gain of the amplifier 20 should be two times. Generally, the gain of the amplifier 20 is determined in accordance with the ratio of the exposure value during the interval $(t_a-t_o)$ to the exposure value during the intervals $(t_c-t_b)$ and $(t_e-t_d)$, respectively. Thus, the gain of the amplifier 20 is selected 2 if the ratio is 1:1 as mentioned previously and the gain of the amplifier 20 is selected $(1+n)$ if the ratio is 1:n. Thus, in fact the gain of the amplifier 20 can be determined in accordance with any of the individual structural characteristics of the shutter such as the ratio between the opening operation period and the shutting operation period and the ratio between the rate of opening operation and the rate of shutting operation of the shutter and the gain is determined as a constant peculiar to the system.

Then, when the output of the flip-flop 102 goes to "H", the AND gate 103 is opened. The output pulses of the oscillator 104 are delivered as a driving signal $S_3$ through the AND gate 103 and the buffer amplifier 105 and the pulse motor 4 is rotated in response to its pulses. Simultaneously, the counter 24 counts the amount of exposure light from the starting time of the opening operation of the shutter 3 and also the counter 106 starts counting the oscillator output pulses. Then, the opening of the shutter 3 is completed at the time $t_a$ and thus the comparator 108 generates an equality pulse thereby changing the output of the flip-flop 102 to go to "L" and causing the switching signal $S_4$ to go to "L". Thus, from the time $t_a$ on the switch 21 is switched to the contact B.

As a result, with the gain of the amplifier 20 being increased, the counter 24 counts during the time interval $t_o$ to $t_a$ the exposure value in the form of a quantity having preliminarily superposed thereon the excessive exposure value for the period of the shutting operation of the shutter.

After the time $t_a$, the counting of the exposure value is continued without passing through the amplifier 20. In accordance with the broken line A' of FIG. 4, the shutter closing signal $S_1$ is changed to "H" by the comparator 25 at the time $t_b$ when the count value becomes equal to the proper exposure value preset by the setting means 26. When this occurs, the flip-flop 100 is reset and its output goes to "L". On the other hand, the flip-flop 102 again changes its state in response to the "H" level closing signal $S_1$ and its output goes to "H". As a result, the pulse motor 4 rotates the shutter 3 another ¼ of a revolution in the like manner as mentioned previously. At this time, the output of the flip-flop 100 is at "L" and therefore the output of the AND gate 109 or the switching signal $S_4$ remains at "L".

Figure 6:
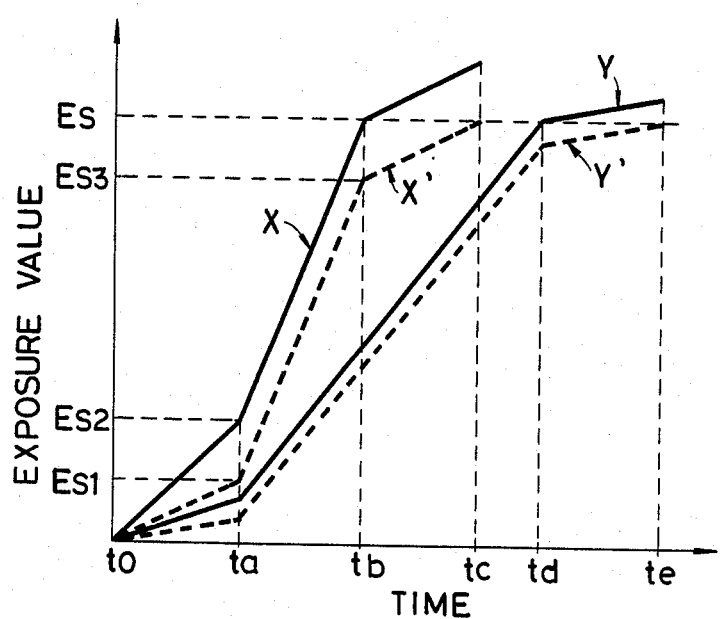
FIG. 6 is a graph showing an exposure control characteristic according to the invention.

FIG. 6 is an exposure control characteristic diagram of the above-described embodiment of FIGS. 4 and 5, in which characteristics X and X' show the cases where the light intensity of the light source is high and characteristics Y and Y' show the cases where the light intensity is low. Also, the characteristics X and Y show the variations of the exposure values measured by the counter 24 and the characteristics X' and Y' show the variations of the exposure value actually reaching the glass substrate 7 (the reticle or mask). In FIG. 6, the abscissa represents the time elapsed since the shutter opening operation starting time $t_o$ and the ordinate represents the exposure value with symbol $E_S$ showing the proper exposure value. As will be seen from FIG. 6, during the interval between the time $t_o$ and the opening completion time $t_a$ the characteristics X and X' or Y and Y' differ in slope due to the gain increased for the purpose of superposed measurement of the excessive exposure value as mentioned previously. In FIG. 6, with the characteristics X and X', the portion corresponding to the excessive exposure value is $(E_S - E_{S3})$ and the gain of the amplifier 20 is determined such that the portion $(E_S - E_{S3})$ becomes equal to the raised portion $(E_{S2} - E_{S1})$. Of course, this is the same with respect to the characteristics Y and Y'.

Since the counter 24 additionally counts the quantity corresponding to a predetermined excessive exposure value during the time interval from $t_o$ to $t_a$, after the opening of the shutter 3 has been completed, the exposure control can be effected accurately by simply comparing the measured quantity with the present proper exposure value and any complification of the circuit construction can be avoided.

Also, while, in FIG. 6, after the characteristic X or Y reaching the proper exposure value $E_S$ the counter 24 counts the exposure value during the shutting operation of the shutter 3 and increases the output, the count value of the counter 24 attained after the starting time $t_b$ or $t_d$ of the shutting operation has no meaning with respect to the exposure control. Therefore, the circuit of FIG. 5 may be modified so that the output of the flip-flop 102 is delivered directly as a switching signal $S_4$ and the flip-flop 100 and the AND gate 109 are eliminated. While this modification has the effect that during the opening operation period (from $t_o$ to $t_a$) and the shutting operation period (from $t_b$ to $t_c$ and from $t_d$ to $t_e$) of the shutter 3 the switch 21 is switched to the contact A and the light measuring sensitivity is enhanced, the increase of the light measuring sensitivity during the shutting operation period has no effect on the exposure control as mentioned previously and it is possible to enjoy the advantage of the simplified circuit construction eliminating the flip-flop 100 and the AND gate 109.

Figure 7:
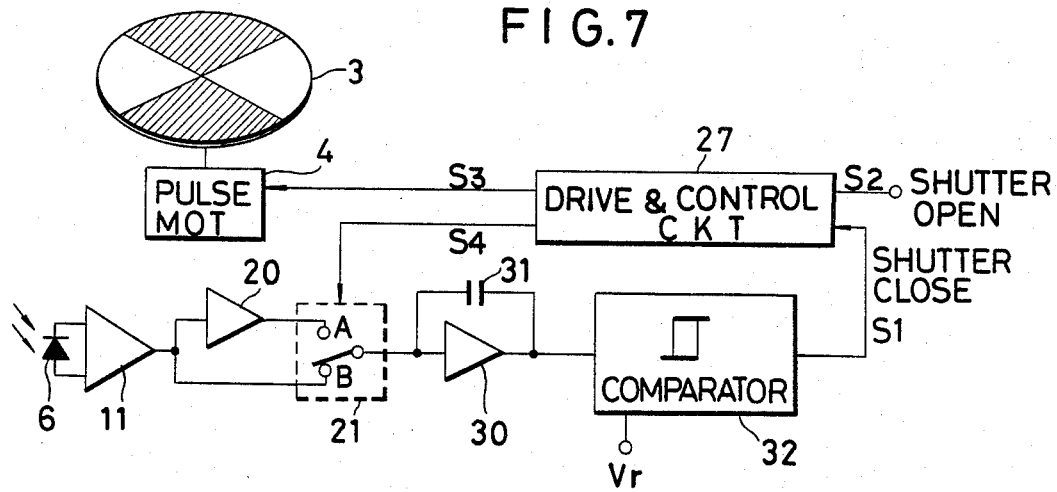
FIG. 7 is a circuit block diagram showing another embodiment of the invention.

FIG. 7 shows another embodiment of the invention and the component parts designated by the same reference numerals as used in FIG. 4 are of the same functions.

In this embodiment, the amount of exposure light is measured in an analog manner and the output of the switch 21 is applied to an integrator circuit including an amplifier 30 and a capacitor 31. The output generated from the amplifier 30 of the integrator circuit is a so-called integrated light quantity value. This integrated value is compared with a preset voltage $V_r$ corresponding to the proper exposure light value by an analog comparator 32 so that when the two become equal, the comparator 32 generates the similar shutter closing signal $S_1$ as mentioned previously. The remainder is the same as in the case of FIG. 4.

By thus measuring the exposure value analogically, it is possible to make the circuit construction extremely small and compact as compared with that used when the measurement is effected digitally.

Figure 8:
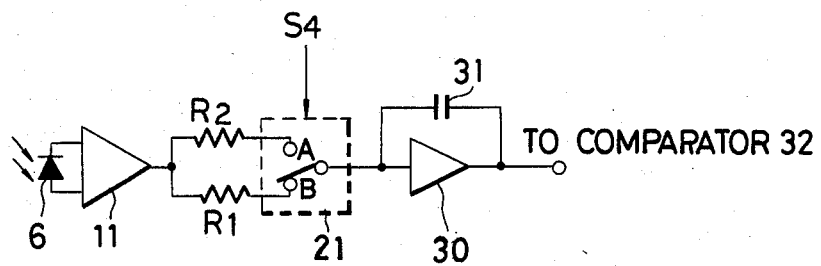
FIG. 8 is a circuit block diagram showing the principal part of a modification of the embodiment of FIG. 7.

FIG. 8 is a partial circuit diagram showing a modification of the embodiment shown in FIG. 7, in which instead of varying the gain by means of the amplifier 20, resistors $R_1$ and $R_2$ are connected to the output of the amplifier 11 and these resistors are selectively connected to the integrator circuit by the switch 21. The resistance values of the two resistors are selected $R_1 > R_2$ with the result that when the switch 21 is connected to the contact A, the time constant determined by the resistor $R_2$ and the capacitor 31 becomes smaller than the time constant determined by the resistor $R_1$ and the capacitor 31 when the switch 21 is connected to the contact B and thus the integration sensitivity is increased. As mentioned previously, it is arranged so that when the opening operation rising characteristic of the shutter 3 is equal to its shutting operation falling characteristic, that is, the exposure value during the time interval $(t_a - t_o)$ is equal to the exposure light quantity during the time interval $(t_c - t_b)$ or $(t_e - t_d)$, there results $R_1/R_2 = 2$.

It will be seen that in the case of the analog system, the switching between the two time constants of the integrator circuit makes it possible to eliminate the amplifier 20 and thereby makes the circuit smaller and more compact.

Figure 9A:
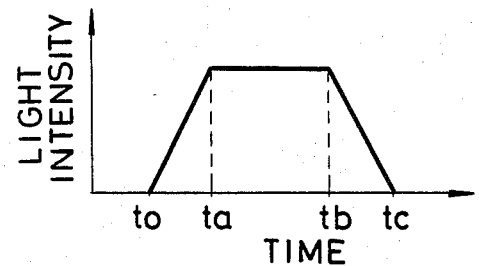
FIGS. 9a and 9b are graphs showing light intensity characteristics based on the shutter opening and shutting operations in the uniform drive mode and the variable drive mode, respectively.

Note that in the above-described embodiments the pulse motor 4 for driving the shutter 3 is operated at a uniform speed. Thus, as also shown in FIG. 2, during the opening and shutting operations of the shutter 3 the rising and falling of the light intensity characteristics through the shutter 3 become linear as shown in FIG. 9a. However, there is an apprehension for the problem of response in that any attempt to rapidly rotate the pulse motor 4 with pulse signals of a high frequency fails to effect a proper starting thus causing a so-called out of step.

Figure 9B:
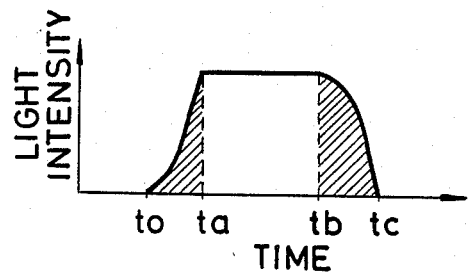

This problem can be solved by subjecting the driving of the pulse motor 4 to a variable speed control by means of a microcomputer or the like such that the light intensity rises smoothly from the shutter opening starting time $t_o$ to the time $t_a$ and the light intensity falls smoothly from the shutter closing starting time $t_b$ to the time $t_c$ as shown in FIG. 9b. In this case, even if $(t_a - t_o) = (t_c - t_b)$, the ratio of the exposure value during the opening operation (the hatched area during the interval from $t_o$ to $t_a$) to the exposure value during the shutting operation (the hatched area during the interval from $t_b$ to $t_c$) does not result in 1:1. However, if the ratio is selected 1:n, this ratio itself assumes a constant value peculiar as a system constant as mentioned previously and thus the gain of the amplifier 20 must be selected (1+n) in the embodiment of FIG. 4 or 7, for example. Also, in the embodiment of FIG. 8 the ratio $R_1/R_2$ between the resistors $R_1$ and $r_2$ must be selected (1+n). Further, with $(t_a-t_o)=(t_c-t_b)$, if the ratio $(t_a-t_o)/(t_c-t_b)$ is similarly always maintained at a constant value during the operation of the shutter 3, it is necessary to compensate the gain of the amplifier 20 or the ratio between the resistors $R_1$ and $R_2$.

Still further, the shutter driving motor is not limited to the pulse motor used in these embodiments and the embodiments may be modified so as to use a dc motor, for example. In this case, it is only necessary to modify such that the drive and control circuit 27 includes a dc power supply in place of the oscillator 104 and the output of a photo coupler or the like for detecting the on and off conditions of the shutter is used in place of the counter 106, the register 107 and the comparator 108.

Still further, the present invention is not limited to the exposure apparatus of the projection type and it is applicable to the exposure apparatus of any other type.

What is claimed is:

1. An apparatus for controlling an exposure of an object to be exposed comprising:
   (a) means for generating a radiation;
   (b) means for directing said radiation from said radiation generating means to said object to be exposed, said radiation directing means including shutter means for opening and shutting a radiation path from said radiation generating means to said object to be exposed and thereby controlling the passage and interception of said radiation to said object;
   (c) means for detecting an intensity of said radiation passed through said shutter means to generate detection signal indicative of said detected intensity;
   (d) radiation measuring means responsive to said detection signal to measure an exposure value falling on said object from a start of an opening operation of said radiation path by said shutter means and generate an output signal indicative of an exposure value on said object;
   (e) Shutter control means responsive to said output signal from said radiation measuring means to cause said shutter means to start shutting of said radiation path when the exposure value on said object reaches a predetermined value; and
   (f) radiation measurement control means for controlling a radiation measuring sensitivity of said radiation measuring means such that the exposure value measured by said measuring means during an interval between said start of opening of said radiation path by said shutter means and a completion of said opening represents a value indicative of a superposition of the exposure value on said object during the interval between said start of opening of said radiation path and the completion of said opening and the exposure value on said object during another interval between said start of shutting of said radiation path and a completion of said shutting.

2. A system according to claim 1, wherein said radiation measuring means comprises means for amplifying said detection signal, and means for varying an amplification factor of said amplifying means during the interval between the start of opening of said radiation path by said shutter means and the completion of said opening.

3. A system according to claim 1, wherein said radiation measuring means comprises means for amplifying said deteciton signal and means for integrating said detection signal amplified by said amplifying means, and wherein said integrating means vary time constant in response to the completion of opening of said radiation path by said shutter means.

* * * * *